United States Patent
Engelhardt et al.

(10) Patent No.: US 6,864,175 B2
(45) Date of Patent: Mar. 8, 2005

(54) METHOD FOR FABRICATING INTEGRATED CIRCUIT ARRANGEMENTS, AND ASSOCIATED CIRCUIT ARRANGEMENTS, IN PARTICULAR TUNNEL CONTACT ELEMENTS

(75) Inventors: Manfred Engelhardt, Feldkirchen-Westerham (DE); Stefan Wurm, Munich (DE)

(73) Assignee: Infineon Technologies AG, Munich (DE)

( * ) Notice: Subject to any disclaimer, the term of this patent is extended or adjusted under 35 U.S.C. 154(b) by 524 days.

(21) Appl. No.: 09/957,363

(22) Filed: Sep. 20, 2001

(65) Prior Publication Data

US 2002/0076572 A1 Jun. 20, 2002

(30) Foreign Application Priority Data

Sep. 29, 2000 (DE) .......................... 100 48 420

(51) Int. Cl.⁷ ........................................... H01L 21/461
(52) U.S. Cl. ................. 438/691; 438/692; 438/627; 438/631; 438/637; 438/640; 438/674
(58) Field of Search .................. 438/627, 631, 438/633, 635, 637, 640, 674, 675, 691, 692, 3; 257/30; 205/119; 216/72, 75; 360/324.2

(56) References Cited

U.S. PATENT DOCUMENTS 5,256,565 A    10/1993   Bernhardt et al.
5,835,314 A    11/1998   Moodera et al.
6,677,165 B1 *  1/2004   Lu et al. .......................... 438/3
6,744,608 B1 *  6/2004   Sin et al. ................... 360/324.2
2003/0030948 A1 *  2/2003   Umetsu ................... 360/324.12

FOREIGN PATENT DOCUMENTS

EP     0 913 830 A2    5/1999
EP     0 936 666 A2    8/1999
JP     62103843 A      5/1987

OTHER PUBLICATIONS

Duvail, et al.; *Electrodeposition of patterned magnetic nanostructures*: Journal of Applied Physics, vol. 84, No. 11.

Yang, et al.; *Shape Evolution of Electrodeposited Bumps with Deep Cavity*; J. Electrochem, Soc., vol. 145, No. 9, Sep. 1998.

* cited by examiner

Primary Examiner—Minh-Loan Tran
(74) Attorney, Agent, or Firm—Welsh & Katz, Ltd.

(57) ABSTRACT

The invention relates to a method in which an eclectically nonconductive mask layer is applied to an electrically conductive contact layer which is supported by a substrate layer. A free space is made in the mask layer. Then, a plurality of layers are electrochemically deposited in the free space. Then, layers are applied above the layer which was deposited last. Then, in a removal process, the mask layer is removed down to the height of the top layer.

13 Claims, 5 Drawing Sheets

Figure 1:
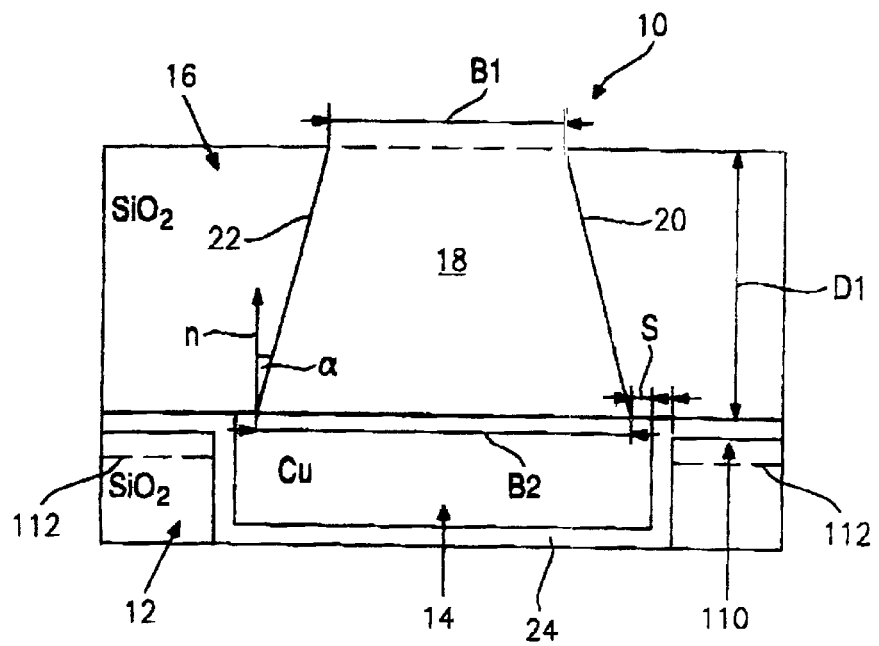

METHOD FOR FABRICATING INTEGRATED CIRCUIT ARRANGEMENTS, AND ASSOCIATED CIRCUIT ARRANGEMENTS, IN PARTICULAR TUNNEL CONTACT ELEMENTS

The invention relates to a method in which an electrically conductive contact layer is supported by a substrate layer, for example by a silicon wafer. An electrically nonconductive mask layer, for example a photoresist, is applied to the electrically conductive contact layer. Then, part of the mask layer is removed, in order for at least one electrically conductive layer subsequently to be applied to the contact layer in the free space which is formed.

Approximately the following conductivities $\kappa$ can be given for nonconductive layers, i.e. for insulator layers, for semiconductor layers and for electrically conductive layers:

organic and inorganic insulators $\kappa=10^{-18}$ to $10^{-7}\ \Omega^{-1}$, semiconductors $\kappa=10^{-7}$ to $10^{-4}\ \Omega^{-1}/m^{-1}$, and electrically conductive layers, in particular metal layers, $\kappa>10^4\ \Omega^{-1}/m^{-1}$, in particular in the range $\kappa=10^4$ to $10^5\ \Omega^{-1}/m^{-1}$.

Various methods for applying the electrically conductive layers during the fabrication of integrated circuit arrangements are known, including:

vapor deposition, sputtering, and electrochemical deposition.

When using vapor deposition and sputtering, layers which, firstly, may have an uneven thickness above the silicon wafer are deposited over the entire silicon wafer. Secondly, layer sections within free spaces of the mask layer have different thicknesses, in particular in the vicinity of steps. These drawbacks cause problems for many applications. Vapor deposition and sputtering are possible both for the application of electrically conductive layers and for the application of electrically nonconductive layers.

Electrochemical coating methods can be used to deposit layers with a very uniform layer thickness. A distinction is drawn between electrodeposition and deposition which does not use external current. In the case of the electrodeposition of metal, electrons are supplied by an external current source. A z-times positively charged metal ion is reduced by taking up z electrons, z being an integer greater than 0. No external current source is required for the deposition of metals without using external current. The electrons required for the reduction originate from a reducing agent which is contained in an electrolyte solution. Electrochemical deposition is only possible for electrically conductive layers.

It is an object of the invention to describe simple methods for the fabrication of an integrated circuit arrangement with electrically conductive and electrically nonconductive layers. In addition, it is intended to provide associated integrated circuit arrangements and a tunnel contact element.

The object relating to the method is achieved by the method steps described in patent claim 1. Refinements are given in the subclaims.

In the method according to the invention, in addition to the method steps described in the introduction, at least one electrically conductive layer is electrochemically deposited in the free space, which is formed during the removal of parts of the mask layer, by means of electrochemical deposition.

During the electrochemical deposition, no materials are precipitated on the electrically nonconductive mask layer. This eliminates the need for steps which would be required in order to remove such materials. The use of an electrochemical coating method means that layers of uniform thickness are formed within the free space. Moreover, the layers can be very thin, for example less than 2 nm thick. The thickness of the layers is uniform both within the free space and at different locations on a silicon wafer with a diameter of, for example, 200 or 300 mm. Electrochemical coating is a very inexpensive coating method compared to vapor deposition or sputtering. Consequently, the lower part of the layer system can be produced with relatively little outlay. For the fabrication of very thin layers, the yield during the fabrication of integrated circuit arrangements rises considerably, since the thickness of the layers which are deposited can be set relatively accurately in technological terms.

Moreover, in the method according to the invention, after the electrochemical deposition an electrically nonconductive layer is introduced into the free space. Consequently, electrochemical deposition of further layers is no longer possible. One further layer or a plurality of further layers are introduced into the free space using other coating techniques. The further layer or layers may be electrically conductive, electrically nonconductive or semiconducting. During the application of the further layer or layers, layers of the same materials are formed outside the free space. These layers are removed in a removal process.

Therefore, the component which is to be fabricated is already present in the free space even before the removal process. Measures for laterally delimiting the applied layers, as are often required with conventional coating methods, are no longer necessary. Such measures would lead to mixing of materials at the side edges. In unfavorable situations, this mixing of materials would lead to the electrically nonconductive layer being bridged by electrically conductive material, thus leading to an electrical short circuit. However, the method according to the invention avoids just such a bridging effect. Consequently, it is possible to produce components with a high yield.

In the method according to the invention, the layer deposited last is completely or partially oxidized to form an electrically nonconductive layer in an oxidation operation which is preferably carried out anodically. The result of this measure is that the nonconductive layer can be fabricated from a conductive layer. During the oxidation, the thickness of the layer only changes to an insignificant extent, and does so uniformly. Consequently, the thickness of the nonconductive layer is uniform. Alternatively, an electrically nonconductive layer is applied, for example by sputtering or vapor deposition, to the layer which was deposited last. In this alternative, a uniform foundation for the nonconductive layer which is applied is produced by the deposition of the preceding layers. This also leads to a more uniform nonconductive layer. In many applications, the nonconductive layer is the layer which is critical for fabrication, e.g. the thinnest layer. The use of the method according to the invention allows the nonconductive layer to be applied with lower tolerances. This also increases the yield during the fabrication of the integrated circuit arrangement.

If electrodeposition, i.e. with external current, is used, the electrically conductive contact layer and/or the electrically conductive layers which have been deposited above it form the anode. When using certain materials for the electrically conductive contact layer, for example in the case of copper or highly doped semiconductors, what are known as diffusion barriers and/or adhesion layers are used, referred to below as interlayers. The interlayer consists, for example, of TaN (tantalum nitride). The interlayer can also be used as an anode for electrodeposition. If the interlayer extends as far as the edge region of the processed silicon wafer, external current can easily be supplied via the edges of the silicon wafer. Direct current or alternating current can be used for the electrodeposition.

In one refinement, the mask layer overlaps the electrically conductive layer on all sides. In the refinement, at least two electrically conductive layers of different materials are deposited in succession. The overlapping on all sides ensures that only the first material reaches the electrically conductive contact layer. The first layer is then deposited with a uniform thickness. During deposition of the second layer, material from this layer no longer reaches the electrically conductive contact layer. The second electrically conductive layer is deposited in a uniform thickness above the layer applied previously. The edge regions of the layers also have the same thickness as the remainder of the layer. There is no curvature in the edge regions caused by a different layer thickness.

As has already been mentioned, the thickness of the mask layer is dimensioned in such a way that the further layer lies below the opening of the free space. In a refinement, a removal process in a subsequent method step is used to remove regions which lie outside the free space and have formed during the application of the further layer. Consequently, these regions no longer impede the further fabrication of the integrated circuit arrangement. By way of example, a chemical-mechanical polishing (CMP) process is used for the removal. It is also possible to remove part of the mask layer. The remainder of the mask layer remains on the substrate layer and delimits the layer system within the free space on all sides.

In a further refinement, a sealing layer is applied prior to the polishing process, occupying the as yet unfilled space of the free space. During the polishing process, the sealing layer is removed down to the height of the layer which was applied last. The result of the sealing is that during subsequent method steps no material enters the space between the further layers and the mask layer. Such material would change the electrical properties of the layer system.

In an alternative refinement, the mask layer is completely removed during the removal process, for example by what is known as a lift-off process. As a result, the layers which form outside the free space during the application of the further layer are also removed and do not disrupt the further method steps.

In one refinement of the alternative, the mask layer consists of an organic material. The mask layer is dissolved off with the aid of a suitable solvent. All organic materials which can be used in semiconductor technology are suitable materials for the mask layer. The trend is toward organic materials with low dielectric constants. Examples of materials of this type are polyimides, which if appropriate may be mixed with fluorine. Moreover, spin-on glass materials, i.e. glass materials which are applied to the substrate layer using the spinning method, are also used. Other possibilities are alkylsilanes, ultra low-k materials, such as for example Teflon, porous dielectrics, such as for example aerogels, or also SiLK, a hydrocarbon compound which does not contain any silicon.

In one configuration, an encapsulation layer is applied after the removal of the mask layer. The encapsulation layer is removed down to the height of the layer which was applied last, preferably using a chemical-mechanical polishing process. The encapsulation layer is used to encapsulate the layer system, so that no substances disrupt the layer system during the further method steps.

In another refinement, parts of the mask layer are removed, for example by anisotropic etching, in such a way that the free space widens toward the substrate layer, preferably on all sides. The structure which forms is also known as a reentrant structure. The inclination of the walls of the free space, i.e. the overhang is, for example, more than 5 percent with respect to the normal to the substrate layer. By way of example, inclination angles of 5 percent, 10 percent or 20 percent are used. The inclination causes the mask layer to act as what is known as a shadow mask during the application of the further layers. When sputtering the further layers, excessively strong flattened sections in the edge regions of the layer to be applied are prevented by the shadow mask. However, it is also possible to work without inclined side walls.

In a further refinement, the free space is, for example, trapezoid-shaped in cross section. The side walls of the free space along a cross section through the mask layer form, for example, straight lines. This makes it considerably easier to fabricate the free space. However, free spaces which widen toward the substrate layer only in the region of the further layers and then have approximately uniform diameters are also employed.

In another refinement, the mask layer has a planar surface and includes a multiplicity of recesses in which components of a similar type are arranged. The contact layers of a plurality of components are connected to one another, for example in the form of a matrix in rows and columns. This measure makes it easy to feed current to the interconnected contact layers during the electrodeposition. This facilitates the electrodeposition operation even for a very large number of components, for example several hundreds of thousands of components on an integrated circuit arrangement. A plurality of integrated circuit arrangements are fabricated on one silicon wafer with a diameter of 200 mm, 300 mm or above. In the case of integrated circuits, the combination of electrochemical deposition and other coating techniques can be used, and is in many respects superior to the method for the fabrication of an integrated circuit arrangement which has hitherto been employed.

In one refinement, the mask layer is thinner than 100 nm, preferably thinner than 50 nm. At least one layer which is introduced into the cavity is thinner than 5 nm. Particularly with layer thicknesses of this level, the use of the method according to the invention or its refinements result in the fabrication of significantly more homogeneous and more uniform layers than those achieved with other methods. Said layer thicknesses are required, for example, for the fabrication of tunnel contact elements, i.e. for contact elements which exploit what is known as the tunnel effect of electrons through insulators.

Therefore, in another refinement, at least one electrically nonconductive layer which is introduced into the free space is fabricated with a thickness which is such that electrons can only cross through the layer using the tunnel effect.

In one configuration, an electrically conductive layer is introduced into the free space by electrochemical deposition. Then, this layer is oxidized to form an electrically nonconductive layer, preferably by anodic oxidation. This technology can be used in particular for tunnel elements to achieve a high yield during production. This is because sputtering of very thin layers causes problems. Compared to other oxidation methods, anodic oxidation has advantages in terms of the oxidation time and the uniformity of oxidation.

In a further refinement, the following materials are used: a quartz glass or an organic, electrically nonconductive material for the mask layer and/or the sealing layer, aluminum, for example, for the layer deposited last, and/or hard magnetic materials and/or layers of soft magnetic material for further layers which are deposited in the free space or are applied in the free space.

The use of hard magnetic and soft magnetic layers makes it possible to fabricate magnetic memory elements which make use of the tunnel effect. Memories of this type are known as Magnetic Random Access Memories (MRAMs). Hard magnetic materials which are used are:

ferromagnets, such as for example FeMn, NiMn, IrMn and PtMn, pseudo-spin valves, such as for example SrPdMn, or artificial antiferromagnets, such as for example Co/Cu/Co, Fe/Cr/Fe, CoFe/Ru/CoFe.

A common feature of these materials is that a magnetic field with a field strength of, for example, more than 100 Oersted are required in order to change the orientation of the magnetization within the materials.

The soft magnetic material used is, for example, a layer of FeNi or CoPt. Combinations of the hard magnetic and/or the soft magnetic layers are also used.

The invention also relates to a circuit arrangement in which at least one layer of a layer system has been fabricated by electrochemical deposition. The mask layer is older than the layer produced by electrochemical deposition. The mask layer therefore has a dual function. It is used as protection for encapsulation of the layer system and forms a lateral boundary during the electrochemical deposition. Consequently, the technical effects referred to above also apply to the circuit arrangement.

Moreover, the invention relates to a circuit arrangement in which an encapsulation layer encloses a layer system which includes at least one layer deposited by electrochemical deposition. The encapsulation layer is newer than the deposited layer. The technical effects described above also apply to the circuit arrangement, in particular the effects described in connection with the mask layer and its removal.

In addition to the layer deposited by electrochemical deposition or in addition to the layers deposited by electrochemical deposition, in a refinement of the circuit arrangement with encapsulation layer, the layer system includes at least one electrically nonconductive layer, above which further layers are arranged.

Moreover, in a refinement of the circuit arrangement with encapsulation layer, at least one layer of the layer system has a larger basic surface area than a layer which lies between this layer and the contact layer. The widening of the layer surface areas towards the contact layer is attributable to the inclined side walls of a mask layer which has already been removed. Consequently, the technical effects described above also apply to the circuit arrangement.

In refinements of the circuit arrangements, the circuit arrangements have features which also arise in circuit arrangements which have been produced using the method according to the invention or one of its refinements. For example, a sealing layer is used, the side walls of the mask layer are inclined, the materials listed above are employed and/or the layer thicknesses given above are used. The technical effect referred to above correspondingly slide to the refinements.

Furthermore, the invention relates to a tunnel contact element which includes at least two electrically conductive contact layers. Between the contact layers there is an electrically nonconductive barrier layer, the thickness of which is such that electrons can only cross through it using the tunnel effect. The barrier layer and/or a contact layer have been fabricated by electrochemical deposition. This measure allows the layer in question to be fabricated with a high degree of accuracy and a uniform thickness. The yield of tunnel element fabrication is very high.

In a further refinement, the barrier layer is fabricated by anodic oxidation. In this case, one of the electrically conductive contact layers is used as electrode for electrodeposition.

In a refinement, the tunnel contact element has features which also occur in a circuit arrangement which has been fabricated using the method according to the invention or one of its refinements. The features and technical effects described above therefore also apply to the tunnel contact element.

Figure 2:
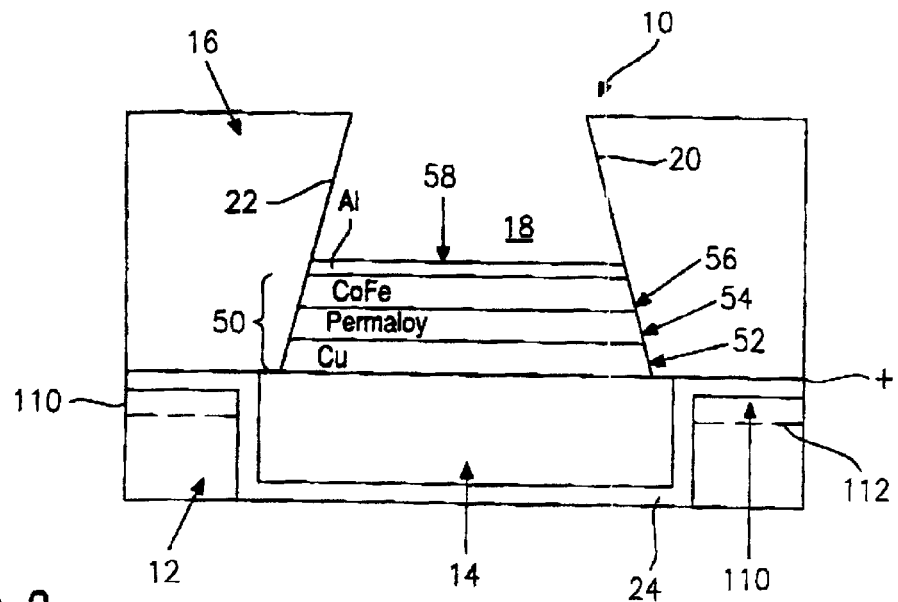
Figure 3:
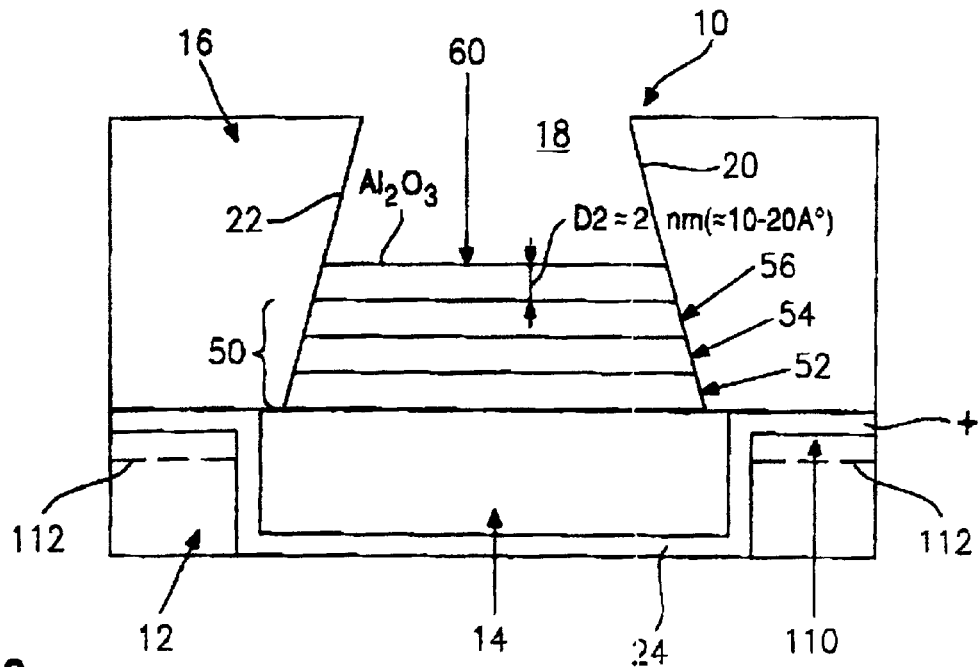
Figure 4:
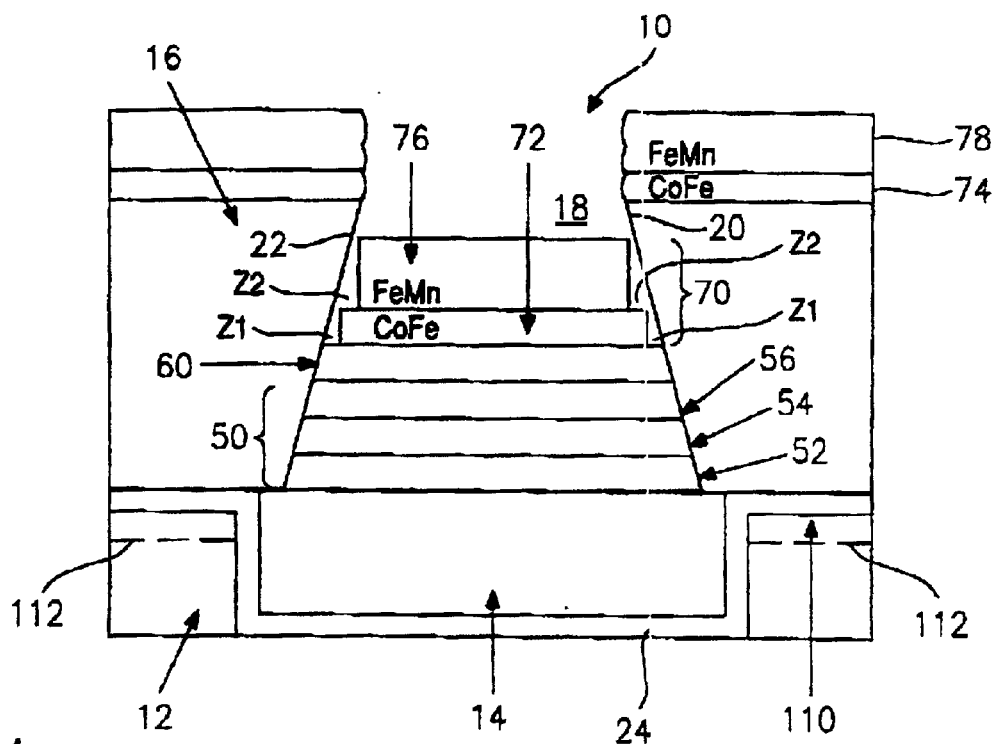
Figure 5:
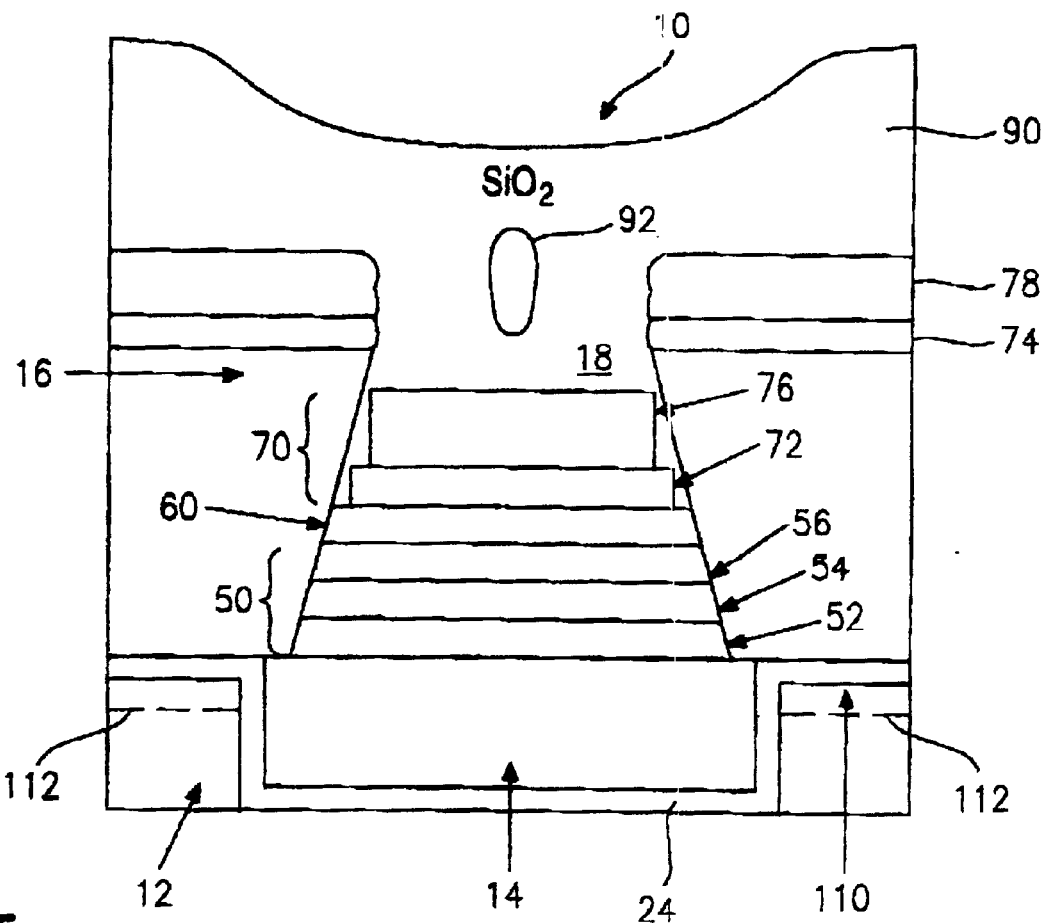
Figure 6:
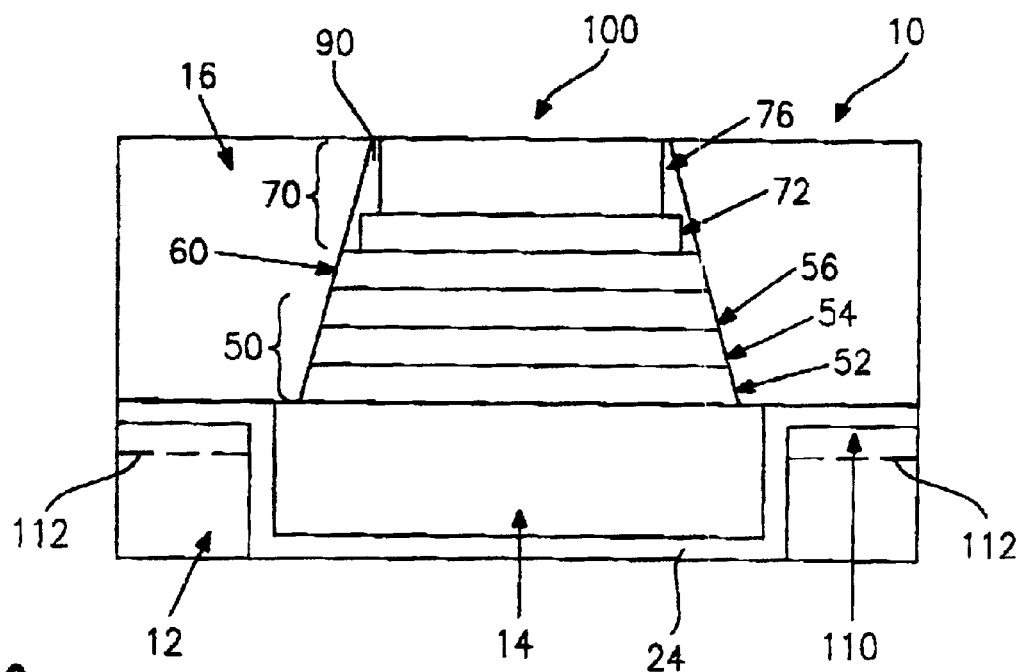
Figure 7:
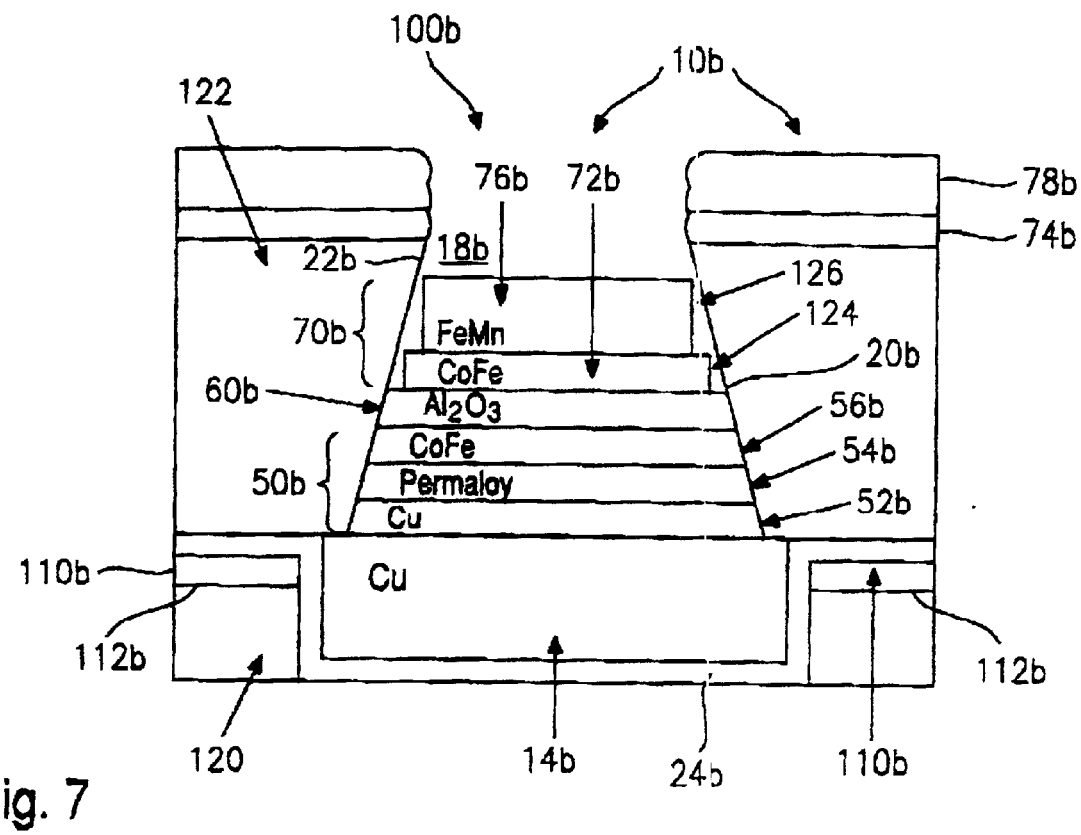
Figure 8:
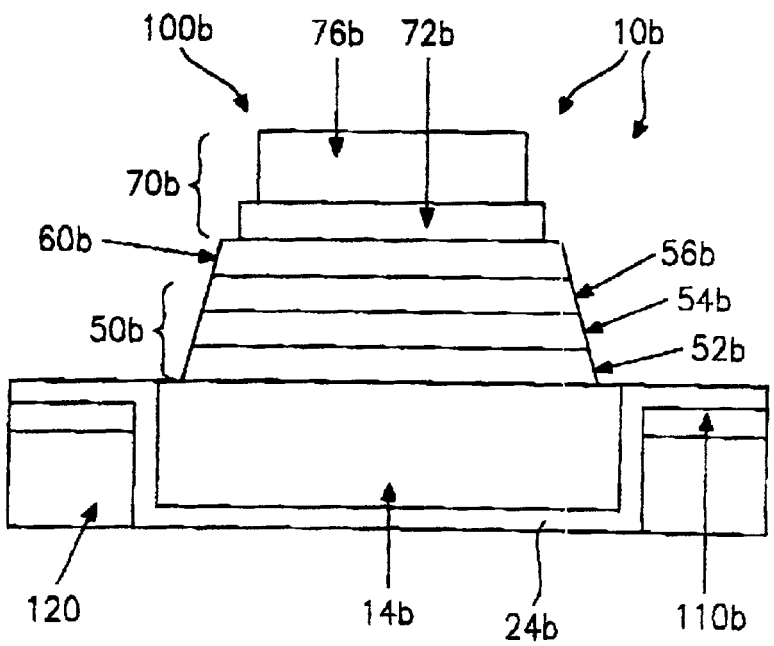
Figure 9:
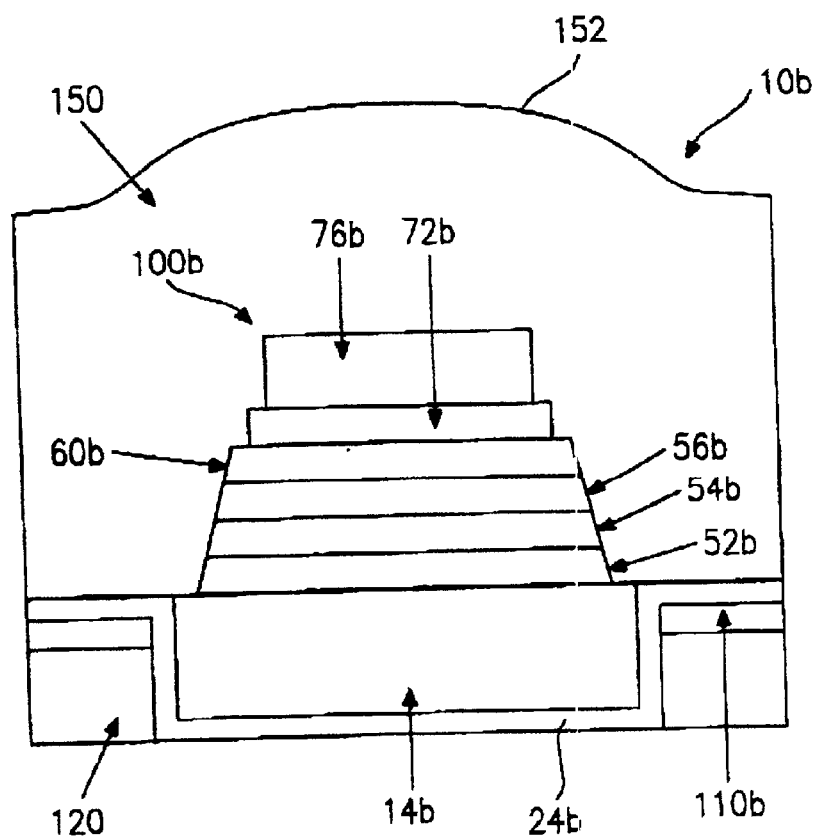
Figure 10:
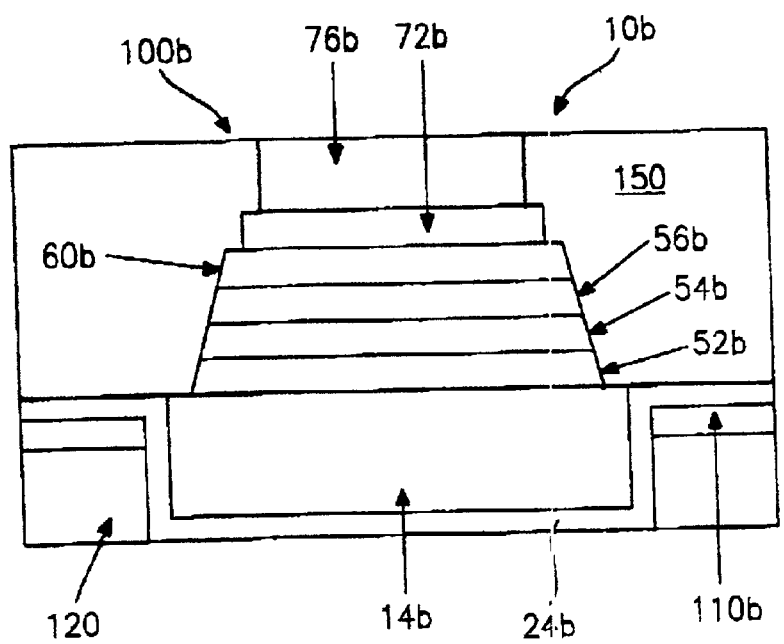

Exemplary embodiments of the invention are explained below with reference to the appended drawings, in which:

FIG. 1 shows the fabrication of an $SiO_2$ structure with an overhang structure (reentrant), i.e. with the structure tapering toward the top, FIG. 2 shows the deposition of a lower metal contact of a tunnel element and of an oxidizing layer, e.g. an aluminum layer, FIG. 3 shows the anodic oxidation of the aluminum layer for fabrication of a tunnel barrier, FIG. 4 shows the application of an upper metal contact of the tunnel element, FIG. 5 shows the application of a sealing layer, for example of $SiO_2$, FIG. 6 shows the sealing level after a leveling process, FIG. 7 shows a structure in accordance with an exemplary embodiment comprising organic materials, FIG. 8 shows the structure after an organic mask layer has been dissolved off, FIG. 9 shows the application of an encapsulation layer, and FIG. 10 shows the structure with leveled encapsulation layer.

FIG. 1 shows the fabrication of a structure 10 which is, for example, trapezoid-shaped in cross section, on a substrate layer 12 comprising, for example, silicon dioxide. A conductor-track contact, for example comprising copper, has been embedded in the substrate layer 12 in a preceding method step. This conductor track is embedded, for example, using the damascene technique. Between substrate layer 12 and conductor-track contact 14 there is a barrier layer which is approximately 5 nm (nanometers) thick and consists, for example, of tantalum nitride. A mask layer 16 of, for example, silicon dioxide is applied to the substrate layer 12 and the conductor-track contact 14. The thickness D1 of the mask layer 16 is greater than the height of a tunnel contact element which is to be fabricated.

Then, the mask layer 16 is structured with the aid of a dry etching process, for example a reactive ion etching process, in order, for example, to produce the structure 10 with a trapezoid-shaped cross section. A structure of this type is also known as a reentrant structure. During the etching process, a free space 18 is formed, the side walls 20 and 22 of which are inclined by an angle α of >3°, for example of approximately 15°, with respect to the normal n to the substrate layer 12 and/or the conductor-track contact 14. Along the cross section illustrated in FIG. 1, the opening of the free space 18 has a width B1 of, for example, 180 nm. The free space 18 widens toward the conductor-track contact 14 and, at the conductor-track contact 14, has a width B2 which is greater than the width B1, e.g. 200 nm. The mask layer 16 remains in place in the edge regions of the conductor-track contact 14 and overlaps the conductor-track contact 14 by an overlap distance S of, for example 20 nm. The etching ends when the surface of the conductor-track contact 14 is reached. The opening of the free space 18 and its basic surface area are, for example, square, rectangular or oval.

FIG. 2 shows the deposition of a lower contact stack 50 of the tunnel element which is to be fabricated. The deposition takes place electrochemically using external current, i.e. by electrodeposition. In this case, a positive potential is applied to the barrier layer 24, which extends as far as the edge regions of the silicon wafers and on which the structure 10 is situated. The mask layer 16 has a high impedance and therefore acts as an electrical insulator. The conductor-track contact 14 has a very good conductivity and therefore acts as an anode during the deposition. First of all, a metal layer 52 of copper is deposited in a uniform thickness on the conductor-track contact 14.

Then, in a second deposition process, by way of example a Permalloy layer 54 is electrodeposited on the copper layer 52. In a subsequent deposition process, by way of example a cobalt-iron layer 56 is electrodeposited on the Permalloy layer 54. The cobalt-iron layer 56 also has a uniform thickness. The thicknesses of the copper layer 52, the Permalloy layer 54 and the cobalt-iron layer 56 are, in this order, for example 3 nm, 4 nm and 1 nm.

In a subsequent method step, an aluminum layer 58 with a uniform thickness of, for example, 1.5 nm is electrodeposited on the cobalt-iron layer 56.

FIG. 3 shows the anodic oxidation of the aluminum layer 58 to form an aluminum oxide layer 60. The oxygen which arrives at the anode oxidizes the aluminum layer 58 uniformly to produce the aluminum oxide layer 60. At the end of the oxidation operation, the aluminum oxide layer 60 has a thickness of, for example, 2 nm. The aluminum oxide layer 60 forms the tunnel barrier of the tunnel contact element which is to be fabricated.

In another exemplary embodiment, the aluminum layer 58 is not completely oxidized all the way through, but rather is only partially oxidized. By way of example, one to three atomic layers of the aluminum layer 58 are retained beneath the aluminum oxide layer 60.

FIG. 4 shows the application of an upper metal stack 70 of the tunnel element which is to be fabricated. In a first process step, for example in a sputtering process, a cobalt-iron layer 72 which is, for example, about 2 nm thick is applied to the aluminum oxide layer 60. Moreover, a space Z1 is formed at the edge of the cobalt-iron layer 72, between this layer and the mask layer 16. Moreover, a cobalt-iron layer 74 is applied to the mask layer 16.

In a subsequent process step, by way of example an iron-manganese layer 76 is applied to the cobalt-iron layer 72. The area occupied by the iron-manganese layer 76 is, furthermore, smaller than the area occupied by the cobalt-iron layer 72. A space Z2 is formed between iron-manganese layer 76 and the mask layer 16. Moreover, an iron-manganese layer 78 is deposited on the cobalt-iron layer 74 during the application.

Then, in the exemplary embodiment, a diffusion barrier of tantalum nitride is also applied, for example in order to prevent diffusion of copper which is subsequently to be applied. This barrier layer is not shown in FIG. 4.

FIG. 5 shows the application of a sealing layer 90, for example of silicon dioxide, to the structure 10. The thickness of the sealing layer 90 is selected in such a way that, in a subsequent polishing operation, the polishing can be stopped at the iron-manganese layer 76 or at the barrier layer which has been applied thereto. A cavity 92 is located above the level at which the polishing operation is stopped and therefore causes no further disruption. The sealing layer 90 penetrates into the remaining free space, all the way to the aluminum oxide layer 60, and fills the remaining free spaces and intermediate spaces with silicon dioxide. As a result, the cobalt-iron layer 72 and the iron-manganese layer 76 are completely encapsulated. Moreover, the sealing layer accumulates above the iron-manganese layer 78.

FIG. 6 shows the level sealing layer 90. Leveling is carried out with the aid of a chemical-mechanical polishing process. The polishing process is ended at the surface of the iron-manganese layer 76 or at the surface of the barrier layer which has been applied thereto. During the polishing operation, the cobalt-iron layer 74 which has been applied to the mask layer 16 and the iron-manganese layer 78 above the cobalt-iron layer 74 are removed. After the polishing operation, the structure 10 then only includes parts of the sealing layer 90 which lie to the sides of the cobalt-iron layer 72 and of the iron-manganese layer 76. After the polishing operation, the fabrication of the upper conductor-track contact can be commenced. The fabrication process which has been explained with reference to FIGS. 1 to 6 leads to the formation of a tunnel contact element 100, the layers of which are of uniform thickness. In particular, the aluminum oxide layer 60 is not electrically short-circuited by materials of the cobalt-iron layer 72 or of the iron-manganese layer 76 above it.

In further method steps, the barrier layer 24 can be separated again from the surface of the structure 10. In the process, side walls made from the material of the mask layer 16 remain in place around the tunnel contact element 100.

In another exemplary embodiment, the substrate layer 12 is fabricated, for example, from an organic and electrically nonconductive material. In this case, the organic substrate layer is closed off by an additional hard mask layer 110 which consists, for example, of SiON, $SiO_2$ or $Si_3N_4$. The boundary between the mask layer 110 and the organic substrate layer is indicated by dashed lines 112 in FIGS. 1 to 6. Otherwise, the method steps and materials explained with reference to FIGS. 1 to 6 remain identical.

FIG. 7 shows a structure 10b in accordance with an exemplary embodiment in which, instead of the substrate layer 12, a substrate layer 120 comprising, for example, an organic material is used. Above the substrate layer 120 there is, for example, a hard mask layer 110b. In the exemplary embodiment illustrated in FIG. 7 too, a barrier layer 24b between substrate layer 120 and conductor-track contact 14b is used to avoid diffusion of the copper of the conductor-track contact 14b into the substrate layer 120. A mask layer 122 comprising an organic material has been applied to the barrier layer 24b and the conductor-track contact 14b. Otherwise, the same method steps as those which have been explained above with reference to FIGS. 1 to 6 for the fabrication of the structure 10 were carried out for fabrication of the structure 10b. Layers of the same material, with the same dimensions and the same function therefore bear the same reference numeral in FIG. 7, but with the added suffix of a lower-case letter b. This applies to the following layers:

- a copper layer 52b,
- a Permalloy layer 54b,
- a cobalt-iron layer 56b,
- a contact stack 50b which includes the layers 52b, 54b and 56b,
- an aluminum oxide layer 60b,
- a cobalt-iron layer 72b applied to the aluminum oxide layer,
- an iron-manganese layer 76b,
- a metal stack 70b which includes the layers 72b and 76b,
- a cobalt-iron layer 74b which has been applied to the mask layer 122, and
- an iron-manganese layer 78b above the cobalt-iron layer 74b.

Side walls 20b and 22b correspond to the side walls 20 and 22, i.e. the side walls 20b and 22b are arranged at the same location and with the same inclination in the structure 10b, for example with respect to the conductor-track contact 14b, as the side walls 20 and 22 in the structure 10 with respect to the conductor-track contact 14. A free space 18b corresponds to the free space 18.

After the process steps involved in the fabrication of the structure 10b illustrated in FIG. 7, the mask layer 122 is dissolved off in a following process step. Spaces 124 and 126 between the cobalt-iron layer 72b and the mask layer 122 and between the iron-manganese layer 76b and the mask layer 122 make it easier for a solvent to penetrate and therefore dissolve the mask layer 122. The layers 74b and 78b which lie on the mask layer 122 are also dissolved away together with the mask layer 122.

FIG. 8 shows the structure 10b after the dissolution process. This process is also known as the lift-off process. The combination of two coating methods, namely electrochemical deposition and sputtering, the use of anodic oxidation for fabrication of the tunnel barrier 60b and the use of the lift-off process prevents electrical short-circuits across the aluminum oxide layer 60b. After the mask layer 122 has been dissolved away, the barrier layer 24b above the hard mask layer 24b is exposed again. The side faces of the tunnel contact element 100b are also exposed during the dissolution.

FIG. 9 shows an encapsulation layer 150 of, for example, an organic material which has been applied to the structure 10b. The encapsulation layer 150 is applied in a thickness which is greater than the height of the tunnel contact element 100b. A projection 152 forms above the tunnel contact element 100b. The encapsulation layer 150 is leveled in a following process step, for example by means of a chemical-mechanical polishing process.

FIG. 10 shows the structure 10b at the end of the polishing process. The polishing process was stopped at the upper face of the iron-manganese layer 76b. This substantially concludes the fabrication of the tunnel contact element 100b. In further method steps, by way of example, an upper conductor-track contact and further components are applied (not shown).

A diffusion barrier which is sputtered on prior to the removal of the mask layer 122 by dissolution can also be used as a stop layer for the polishing process for leveling the encapsulation layer 150.

In another exemplary embodiment, an inorganic material, for example silicon dioxide, is used for the substrate layer 120. In this case, there is no need for a hard mask layer 110b. In this exemplary embodiment, the mask layer 122 consists of an organic material. The encapsulation layer comprises an organic material.

In a further exemplary embodiment, the encapsulation layer 150 consists of an inorganic material, such as for example silicon dioxide. An organic material is once again used for the mask layer 122. The encapsulation layer comprises an inorganic material.

What is claimed is:

1. A method for fabricating an integrated circuit arrangement, in which an electrically nonconductive mask layer is applied to an electrically conductive contact layer which is supported by a substrate layer, the mask layer is removed from a partial region of the electrically conductive contact layer, and in which, in a free space which is formed, at least one electrically conductive layer is deposited by means of electrochemical deposition, a layer deposited last being completely or partially converted into an electrically nonconductive layer in an oxidation operation, or an electrically nonconductive layer being applied to the layer which was deposited last, at least one further layer being applied to the electrically nonconductive layer, the further layer lying in the free space, and at least one layer which is formed outside the free space during the application of the further layer is removed in a removal process.

2. The method as claimed in claim 1, wherein the mask layer overlaps the electrically conductive contact layer on all sides, and wherein electrically conductive layers of different materials are deposited in succession.

3. The method as claimed in claim 1, wherein during the removal process the mask layer remains at the height of the deposited layers and of the further layers.

4. The method as claimed in claim 3, wherein prior to the removal process a sealing layer is applied, which occupies an as yet unfilled space of the free space, and wherein the sealing layer, during the removal process, is removed down to the height of the further layer.

5. The method as claimed in claim 1, wherein the mask layer is also removed during the removal process.

6. The method as claimed in claim 5, wherein the mask layer consists of an organic material, and wherein the mask layer is dissolved off with the aid of a preferably organic solvent.

7. The method as claimed in claim 5, wherein an encapsulation layer is applied after the removal of the mask layer, and wherein the encapsulation layer is removed, preferably using a chemical-mechanical polishing process, down to the height of the further layer.

8. The method as claimed in claim 7, wherein a part of the mask layer is removed, preferably by anisotropic etching, in such a way that the free space preferably widens on all sides toward the substrate layer.

9. The method as claimed in claim 8, wherein the free space is trapezoid-shaped in cross section.

10. The method as claimed in claim 1, wherein the mask layer is less than 100 nm, wherein at least one of the layers which has been introduced into the free space is less than 5 nm.

11. The method as claimed in claim 10, wherein at least one layer which has been introduced into the free space consists of electrically nonconductive material, and wherein this layer has a uniform thickness, which is preferably such that electrons can only cross through the layer by using a tunneling effect.

12. The method as claimed in claim 11, wherein the layer of an electrically conductive material is introduced by electrochemical deposition, wherein the layer is oxidized, to form the electrically nonconductive layer, wherein the layer is preferably partially or completely oxidized.

13. The method as claimed in claim 12, wherein the substrate layer contains materials selected from group consisting of a quartz glass and an inorganic, electrically nonconductive material, wherein the mask layer and the sealing layer contains a material selected from the group consisting of quartz glass and an inorganic, electrically nonconductive material, wherein the layer deposited last contains aluminum which forms a stable oxide, wherein at least one layer of a hard magnetic material and at least one layer of a soft magnetic material is arranged in the free space.

* * * * *